(12) United States Patent
Amarilio et al.

(10) Patent No.: US 7,675,811 B2
(45) Date of Patent: Mar. 9, 2010

(54) METHOD AND APPARATUS FOR DQS POSTAMBLE DETECTION AND DRIFT COMPENSATION IN A DOUBLE DATA RATE (DDR) PHYSICAL INTERFACE

(75) Inventors: Lior Amarilio, Yokneam (IL); David Schkolnik, Haifa (IL); Ophir Nadir, Haifa (IL)

(73) Assignee: Chipx Incorporated, Santa Clara, CA (US)

( * ) Notice: Subject to any disclaimer, the term of this patent is extended or adjusted under 35 U.S.C. 154(b) by 128 days.

(21) Appl. No.: 12/082,100

(22) Filed: Apr. 7, 2008

(65) Prior Publication Data

US 2009/0251976 A1    Oct. 8, 2009

(51) Int. Cl.
G11C 8/18    (2006.01)
G11C 7/00    (2006.01)

(52) U.S. Cl. .................. 365/233.13; 365/193; 365/194; 365/233.1

(58) Field of Classification Search ............. 365/233.13
See application file for complete search history.

(56) References Cited

U.S. PATENT DOCUMENTS

| 5,978,281 | A | 11/1999 | Anand et al. |
| 6,512,704 | B1 | 1/2003 | Wu et al. |
| 6,600,681 | B1 | 7/2003 | Korger et al. |
| 6,603,706 | B1 | 8/2003 | Nystuen et al. |
| 6,850,458 | B2 | 2/2005 | Li |
| 7,038,953 | B2 * | 5/2006 | Aoki ..................... 365/189.05 |
| 7,038,971 | B2 * | 5/2006 | Chung ................... 365/189.16 |
| 7,234,069 | B1 * | 6/2007 | Johnson ..................... 713/400 |
| 7,266,022 | B2 * | 9/2007 | Aoki ..................... 365/189.05 |
| 7,443,738 | B2 * | 10/2008 | Kwack et al. .......... 365/189.05 |
| 7,443,741 | B2 * | 10/2008 | Butt et al. .................... 365/193 |
| 7,596,053 | B1 * | 9/2009 | White et al. ............. 365/233.5 |
| 2003/0086303 | A1 * | 5/2003 | Jeong .................... 365/189.05 |
| 2004/0056697 | A1 * | 3/2004 | Partsch et al. ............... 327/233 |

* cited by examiner

*Primary Examiner*—Son L Mai
(74) *Attorney, Agent, or Firm*—Abelman, Frayne & Schwab

(57) ABSTRACT

Circuitry for reading from a double data rate type memory, the circuitry including control logic, a first bi-directional input/output interface (I/O) configured to be coupled to a data bus of a double data rate type memory and to receive therefrom a data transmission having a duration selected by the control logic, a second bi-directional input/output interface (I/O) configured to be coupled to a data strobe line of the double data rate type memory, a gate coupled to the second bi-directional input/output interface configured for controlling the duration of a data strobe signal received along the data strobe line in response to a data strobe masking gating signal and a data strobe masking gating signal modifier applying to the expected data receipt duration indicating signal a variable time delay such as to center the expected data receipt duration indicating signal about the midpoint of the duration of the data transmission.

16 Claims, 5 Drawing Sheets

METHOD AND APPARATUS FOR DQS POSTAMBLE DETECTION AND DRIFT COMPENSATION IN A DOUBLE DATA RATE (DDR) PHYSICAL INTERFACE

FIELD OF THE INVENTION

The present invention relates to semiconductor integrated circuits generally and more particularly to double data rate memory interfaces.

BACKGROUND OF THE INVENTION

The following U.S. patent Publications are believed to be relevant to the subject matter of the present invention:
U.S. Pat. Nos. 5,978,281; 6,512,704; 6,600,681; 6,603,706; 6,850,458.

SUMMARY OF THE INVENTION

The present invention seeks to provide an improved double data rate memory interface in an integrated circuit.

There is thus provided in accordance with a preferred embodiment of the present invention circuitry for reading from a double data rate type memory, the circuitry including control logic, a first bi-directional input/output interface (I/O) configured to be coupled to a data bus of a double data rate type memory and to receive therefrom a data transmission having a duration selected by the control logic, a second bi-directional input/output interface (I/O) configured to be coupled to a data strobe line of the double data rate type memory, a gate coupled to the second bi-directional input/output interface configured for controlling the duration of a data strobe signal received along the data strobe line in response to a data strobe masking gating signal and a data strobe masking gating signal modifier receiving from the control logic an expected data receipt duration indicating signal and an extent of delay indicating signal and applying to the expected data receipt duration indicating signal a variable time delay based at least in part on the extent of delay indicating signal such as to center the expected data receipt duration indicating signal about the midpoint of the duration of the data transmission.

Preferably, the data strobe masking gating signal modifier is also operative to expand the expected data receipt duration indicating signal by less than a clock cycle prior to applying the variable time delay thereto. Additionally or alternatively, the data strobe masking gating signal modifier is also operative to expand the expected data receipt duration indicating signal by one-half clock cycle prior to applying the variable time delay thereto.

Preferably, the data strobe masking data signal modifier is configured to be operative to center the expected data receipt duration indicating signal about the midpoint of the duration of the data transmission using the following functionality: a. applying to the expected data receipt duration indicating signal a first delay, b. writing to the double data rate type memory at least a first burst of data; c. reading from the double data rate type memory the at least a first burst of data, d. comparing the at least a first burst of data obtained by the reading with the at least first burst of data written to the double data rate type memory during the writing in order to determine whether write/read data integrity exists for the first delay; e. setting an initial data integrity delay to the first delay if write/read data integrity exists for the first delay, f. repeating steps b., c. and d. for increasing delays until write/read data integrity is found to exist for an initial data integrity delay, if write/read data integrity does not exist for the first delay, g. repeating steps b., c. and d. for further increasing delays until write/read data integrity is found to not to exist for a terminal data integrity delay and h. selecting an intermediate delay which is a function of the initial data integrity delay and the terminal data integrity delay and applying the intermediate delay as the variable time delay. Additionally, the functionality also includes repeating steps a.-h. over time to compensate for variations in temperature and voltage.

Alternatively, the data strobe masking gating signal modifier is configured to be operative to center the expected data receipt duration indicating signal about the midpoint of the duration of the data transmission using the following functionality: a. applying to the expected data receipt duration indicating signal a first delay, b. writing to the double data rate type memory at least a first burst of data, c. reading from the double data rate type memory the at least a first burst of data, d. comparing the at least a first burst of data obtained by the reading with the at least first burst of data written to the double data rate type memory during the writing in order to determine whether write/read data integrity exists for the first delay, e. setting an initial data integrity delay to the first delay if write/read data integrity exists for the first delay, f. repeating steps c. and d. for increasing delays until write/read data integrity is found to exist for an initial data integrity delay, if write/read data integrity does not exist for the first delay, g. repeating steps c. and d. for further increasing delays until write/read data integrity is found to not to exist for a terminal data integrity delay and h. selecting an intermediate delay which is a function of the initial data integrity delay and the terminal data integrity delay and applying the intermediate delay as the variable time delay.

Preferably, the data strobe masking gating signal modifier is configured to be operative to center the expected data receipt duration indicating signal about the midpoint of the duration of the data transmission using the following functionality: a. applying to the expected data receipt duration indicating signal a first delay, b. writing to the double data rate type memory at least a first burst of data, c. reading from the double data rate type memory the at least a first burst of data, d. comparing the at least a first burst of data obtained by the reading with the at least first burst of data written to the double data rate type memory during the writing in order to determine whether write/read data integrity exists for the first delay, e. setting an initial data integrity delay to the first delay if write/read data integrity exists for the first delay, f. repeating steps c. and d. for increasing delays until write/read data integrity is found to exist for an initial data integrity delay, if write/read data integrity does not exist for the first delay, f'. writing to the double data rate type memory at least a first burst of data, g. repeating steps c. and d. for further increasing delays until write/read data integrity is found to not to exist for a terminal data integrity delay and h. selecting an intermediate delay which is a function of the initial data integrity delay and the terminal data integrity delay and applying the intermediate delay as the variable time delay.

Alternatively, the data strobe masking gating signal modifier is configured to be operative to center the expected data receipt duration indicating signal about the midpoint of the duration of the data transmission using the following functionality: a. applying to the expected data receipt duration indicating signal a first delay, b. writing to the double data rate type memory at least a first burst of data, c. reading from the double data rate type memory the at least a first burst of data, d. comparing the at least a first burst of data obtained by the reading with the at least first burst of data written to the double data rate type memory during the writing in order to determine whether write/read data integrity exists for the first delay, e. setting an initial data integrity delay to the first delay if write/read data integrity exists for the first delay, f. repeating steps b., c. and d. for increasing delays until write/read data integrity is found to exist for an initial data integrity delay, if write/read data integrity does not exist for the first delay and g. selecting an intermediate delay which is a function of the initial data integrity delay and applying the intermediate delay as the variable time delay.

Preferably, the data strobe masking gating signal modifier is configured to be operative to center the expected data receipt duration indicating signal about the midpoint of the duration of the data transmission using the following functionality: a. applying to the expected data receipt duration indicating signal a first delay, b. writing to the double data rate type memory at least a first burst of data, c. reading from the double data rate type memory the at least a first burst of data, d. comparing the at least a first burst of data obtained by the reading with the at least first burst of data written to the double data rate type memory during the writing in order to determine whether write/read data integrity exists for the first delay, e. setting an initial data integrity delay to the first delay if write/read data integrity exists for the first delay, f. repeating steps c. and d. for increasing delays until write/read data integrity is found to exist for an initial data integrity delay, if write/read data integrity does not exist for the first delay and g. selecting an intermediate delay which is a function of the initial data integrity delay and applying the intermediate delay as the variable time delay.

Preferably, the gate is an AND gate.

Preferably, the circuitry for reading from a double data rate type memory also includes drift detection circuitry operative to provide an indication of a timing relationship between a rising edge of the data strobe masking gating signal and a last falling edge of the data strobe signal to the control logic. Additionally, the indication includes an indication of which one of three possible states of drift is present.

Preferably, the data detection circuitry includes a first latch supplying a first latch output, a second latch supplying a second latch output, a first delay line providing a first delay and a second delay line providing a second delay, and the circuitry includes the following functionality: receiving an input from the second bi-directional I/O interface, providing a first latch input to the first latch, the first latch input to the first latch including the second delay of the data strobe signal, providing a second latch input to the first latch, the second latch input to the first latch including the first delay of the data strobe masking gating signal, providing a first latch input to the second latch, the first latch input to the second latch including the data strobe signal and providing a second latch input to the second latch, the second latch input to the second latch including the first delay of the data strobe masking gating signal, wherein the indication is a function of the first latch output and the second latch output.

Additionally, the input from the second bi-directional I/O interface includes a delayed input. Additionally or alternatively, the first delay includes a 45 degree delay and the second delay includes a 90 degree delay.

Preferably, the control logic is operative to provide the extent of delay indicating signal based on the indication.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENT

Figure 1:
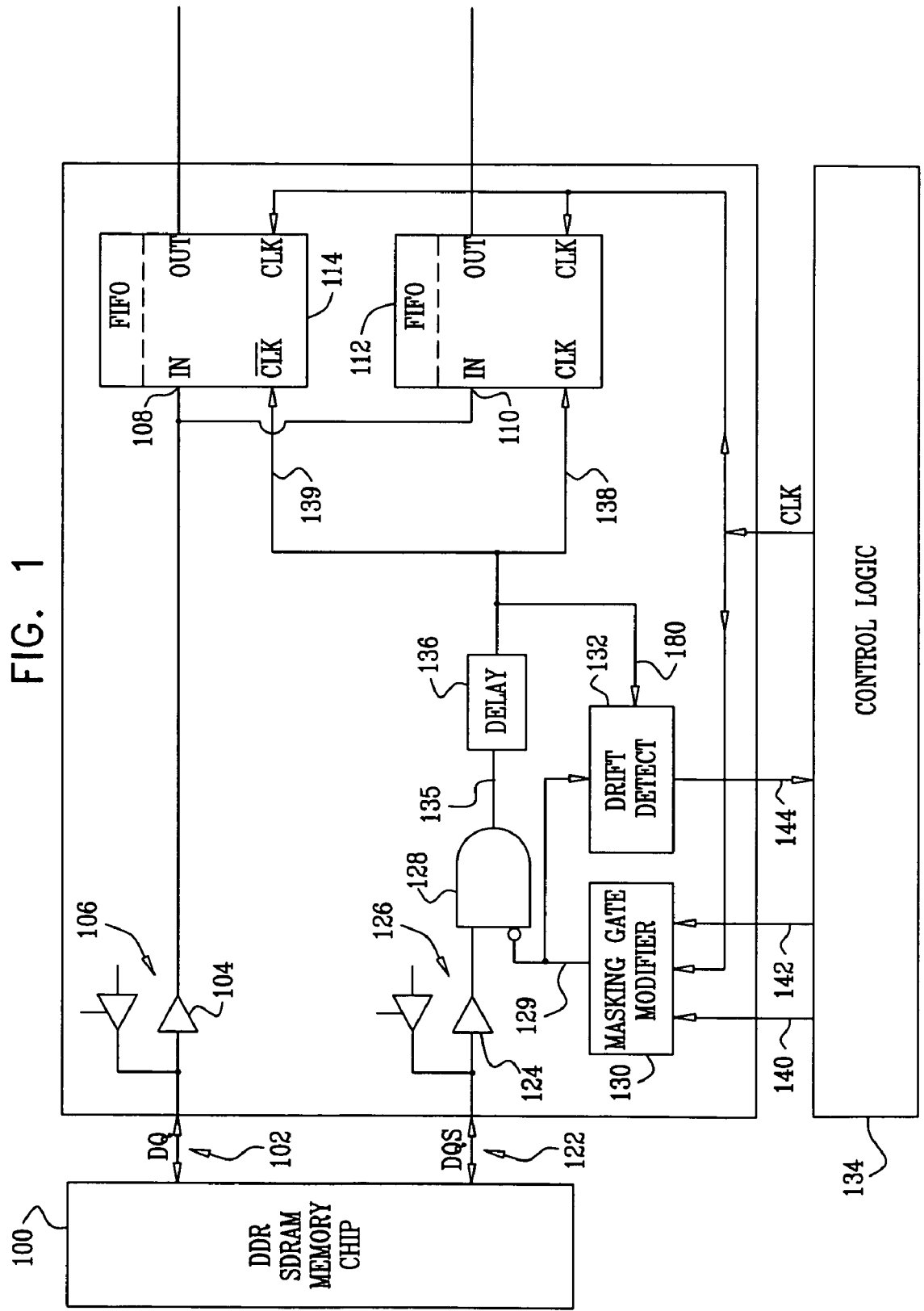
FIG. 1 is a simplified block diagram illustration of a read data circuit constructed and operative in accordance with a preferred embodiment of the present invention.

Reference is now made to FIG. 1, which is a simplified block diagram illustration of a read data circuit constructed and operative in accordance with a preferred embodiment of the present invention which is operative to read data from a double data rate (DDR) synchronous dynamic random access memory (SDRAM) memory chip 100, such as a Model MT47H32M16BN-3 512 Mbit memory, commercially available from Micron, Inc.

A DQ bi-directional data bus 102 provides a read data output from chip 100 via an input portion 104 of a first bi-directional input/output (I/O) interface 106 to respective data-in ports 108 and 110 of a pair of first-in, first-out (FIFO) circuits 112 and 114.

A DQS bi-directional data strobe connection 122 provides a data strobe output from chip 100 via an input portion 124 of a second bi-directional input/output (I/O) interface 126 to an input of a gate, preferably an AND gate 128. It is a particular feature of the present invention that AND gate 128 also receives an output signal 129, preferably a delayed output signal, from data strobe masking gating signal modifier circuitry 130, constructed and operative in accordance with a preferred embodiment of the present invention. Associated with data strobe masking gating signal modifier circuitry 130 is drift detection circuitry 132.

It is appreciated that output signal 129 is preferably an inverted signal received by AND gate 128. Alternatively, gate 128 may be an 'A AND (not B)' gate receiving data strobe output via input portion 124 and output signal 129 as a non-inverted signal.

Data strobe masking gating signal modifier circuitry 130 receives inputs from control logic circuitry 134. Control logic circuitry 134 also provides clock inputs to FIFO circuits 112 and 114.

An output signal 135 of AND gate 128 is supplied via a delay circuit 136 to respective clock inputs 138 and 139 of FIFO circuits 112 and 114. An output of delay circuit 136 is supplied to drift detection circuitry 132.

In accordance with a preferred embodiment of the present invention, in the circuitry of FIG. 1 for reading from a double data rate type memory, first bi-directional I/O interface 106 receives, from data bus 102 of double data rate type memory chip 100, a data transmission having a time duration selected by control logic circuitry 134.

The AND gate 128, which is coupled to second bi-directional I/O interface 126, controls the duration of a data strobe signal received along the data strobe connection 122 in response to a data strobe masking gating signal provided by data strobe masking gating signal modifier circuitry 130. Circuitry 130 receives from the control logic circuitry 134 an expected data receipt duration indicating signal and an extent of delay indicating signal and applies to the expected data receipt duration indicating signal a variable time delay based at least in part on the extent of delay indicating signal, such as to center the expected data receipt duration indicating signal about the midpoint of the duration of the data transmission. The extent of delay indicating signal is responsive, inter alia, to the output of drift detection circuitry 132.

Figure 2:
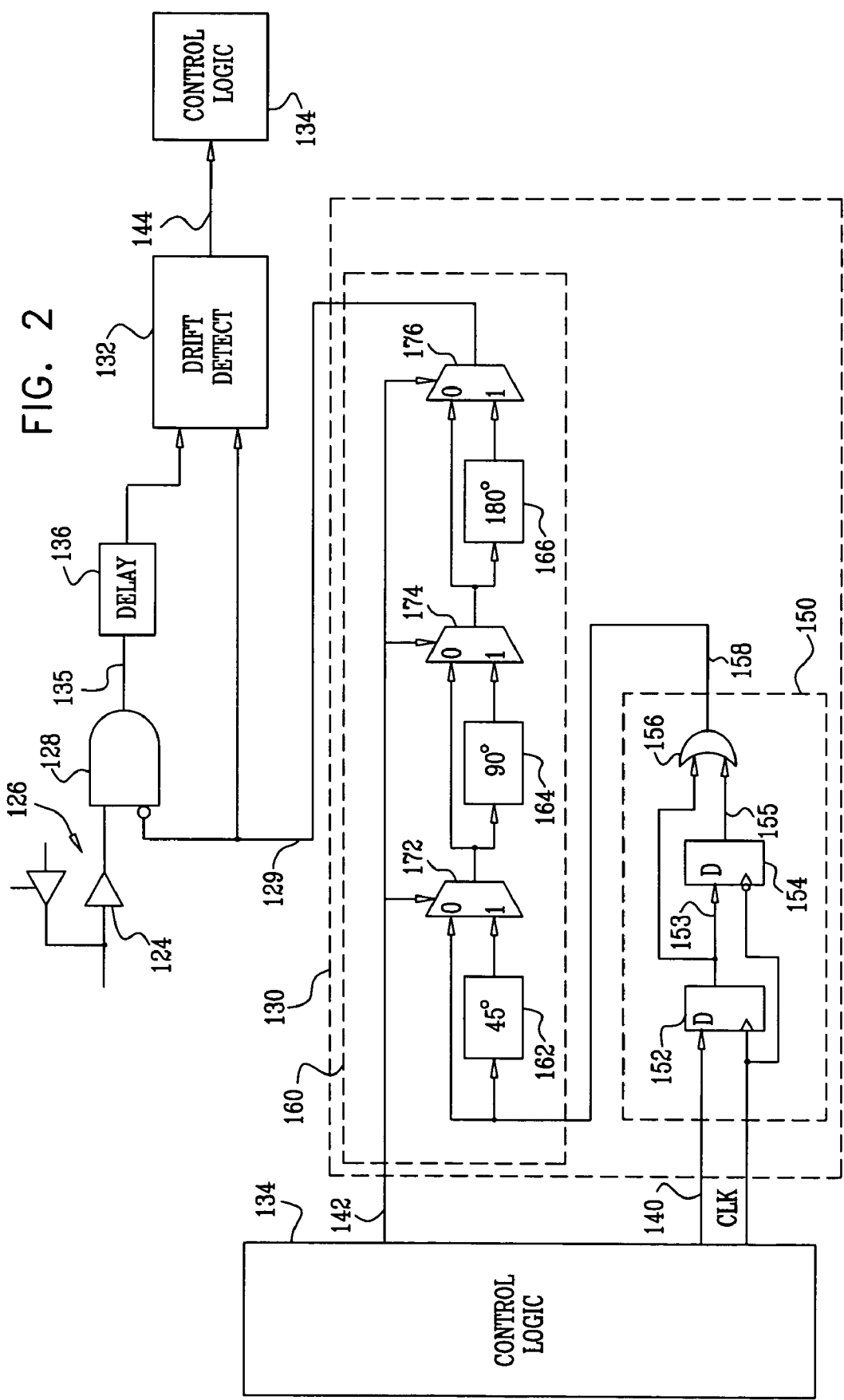
FIG. 2 is a simplified block diagram illustration of data strobe masking gating signal modifier circuitry useful in the circuit of FIG. 1.

Reference is now made to FIG. 2, which is a simplified block diagram illustration of data strobe masking gating signal modifier circuitry 130 useful in the circuit of FIG. 1. As seen in FIG. 2, data strobe masking gating signal modifier circuitry 130 receives a DQS mask input 140 from control logic circuitry 134. The DQS mask input constitutes an expected data receipt duration indicating signal. Circuitry 130 also receives DQS mask shift input 142 from control logic circuitry 134. The DQS mask shift input 142 constitutes an extent of delay indicating signal.

Control logic circuitry 134 receives a drift direction detection input 144 from drift detection circuitry 132 and employs input 144 in producing output 142.

Input 140 is received by half-cycle addition circuitry 150, which forms part of data strobe masking gating signal modifier circuitry 130. Half-cycle addition circuitry 150 includes a first flip-flop 152 which receives a clock input and is active on a rising edge of the clock input. An output 153 of first flip-flop 152 is supplied to a second flip-flop 154, which receives a clock input and is active on a falling edge of the clock input and provides an output 155. An OR gate 156 receives the outputs 153 and 155 of first and second flip flops 152 and 154 and provides an output signal 158 which extends input 140 by one-half clock cycle.

Output signal 158 is supplied to variable delay circuitry 160, which forms part of data strobe masking gating signal modifier circuitry 130 and also receives input 142. Variable delay circuitry 160 preferably comprises three delay lines 162, 164 and 166, arranged in series and providing delays of 45, 90 and 180 degrees respectively and corresponding selectors 172, 174 and 176 at the outputs of respective delay lines 162, 164 and 166, which receive input 142. The variable delay circuitry 160 is thus able to provide a delay of between 0 and 315 degrees to output signal 158 and to provide a suitably delayed output signal 129 to AND gate 128 and to drift detection circuitry 132.

Figure 3:
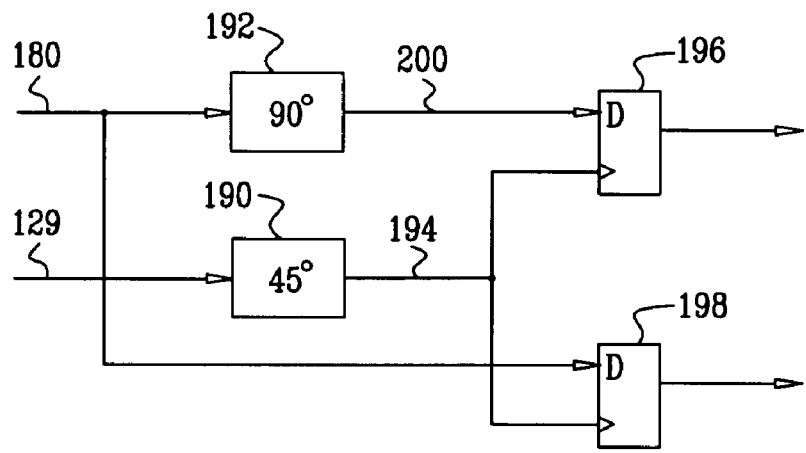
FIG. 3 is a simplified block diagram illustration of drift detection circuitry useful in the circuit of FIG. 1.

Reference is now made to FIG. 3, which is a simplified block diagram illustration of drift detection circuitry 132 useful in the circuit of FIG. 1. As seen in FIG. 3, drift detection circuitry 132 receives an input signal 180 from delay circuit 136 (FIG. 1) and also receives output signal 129 from variable delay circuitry 160 of data strobe masking gating signal modifier circuitry 130. Drift detection circuitry 132 preferably includes two delay lines 190 and 192. Delay line 190 provides a delay of between 0 and 90 degrees, preferably 45 degrees. Delay line 192 provides a delay of 90 degrees. Delay line 190 receives output signal 129 and provides an output 194 to strobe inputs of latches 196 and 198. Delay line 192 receives input signal 180 and provides an output 200 to a data input of latch 196. Latch 198 receives input signal 180 as a data input. The outputs of latches 196 and 198 constitute the drift direction detection input 144 to control logic circuitry 134.

Figure 4:
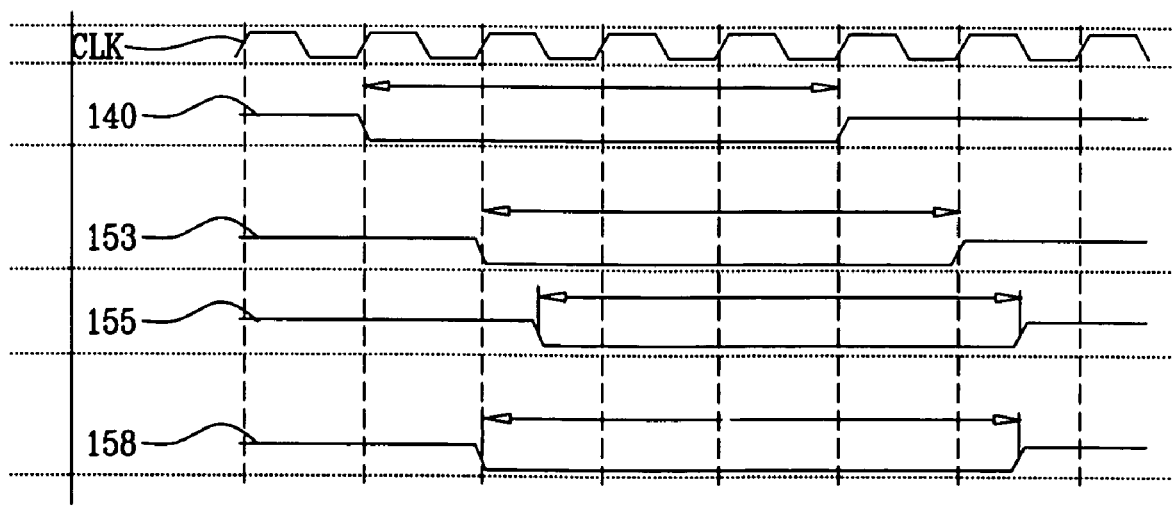
FIG. 4 is a series of timing diagrams illustrating one part of the operation of the circuitry of FIGS. 1 & 2.

Reference is now made to FIG. 4, which is a series of timing diagrams illustrating operation of half-cycle addition circuitry 150 of the circuitry of FIGS. 1 & 2 and illustrating a clock input as well as input 140, flip-flip outputs 153 and 155 and output signal 158.

Figure 5:
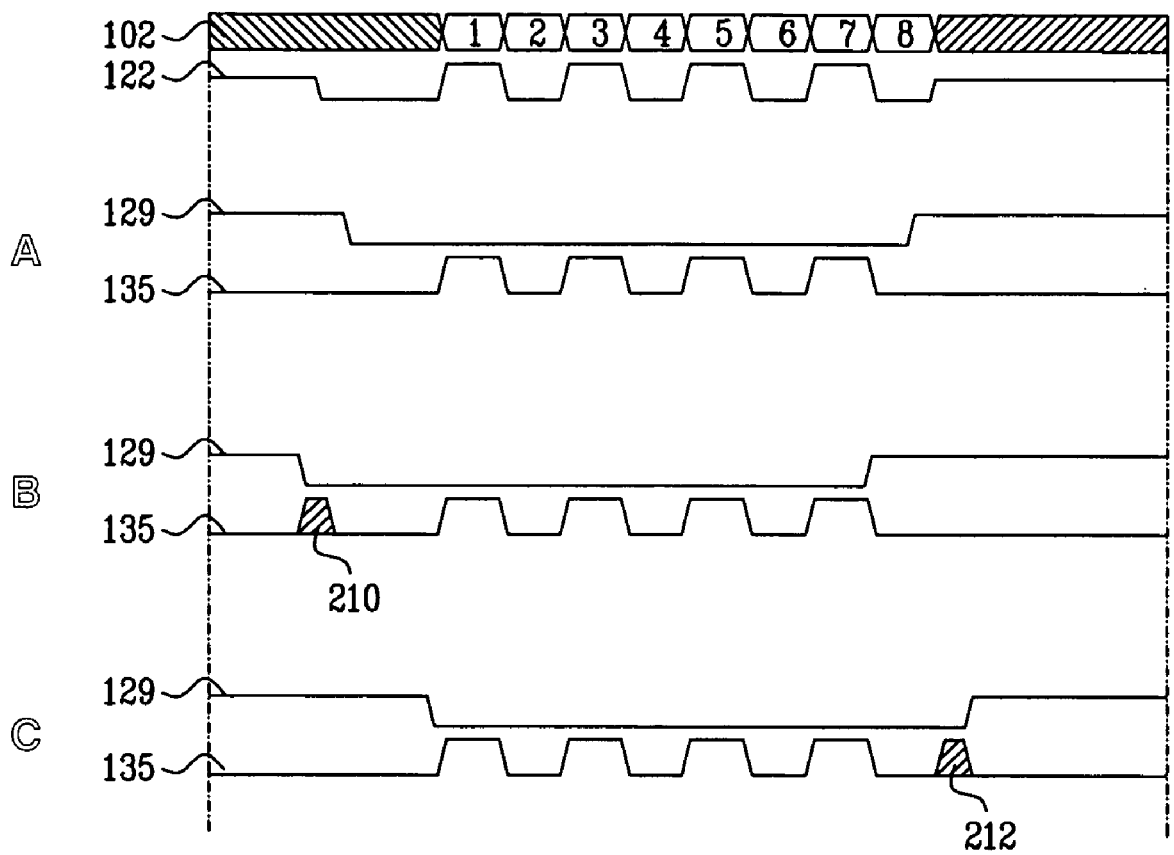
FIG. 5 is a series of timing diagrams illustrating another part of the operation of the circuitry of FIGS. 1 & 2.

Reference is now made to FIG. 5, which is a series of timing diagrams illustrating another part of the operation of the circuitry of FIGS. 1 & 2. FIG. 5 illustrates output signal 135 corresponding to predetermined signals on DQ bi-directional data bus 102 and on DQS bi-directional data strobe connection 122 in three different operational states, here designated A, B and C, corresponding to three different output signals 129.

In state A, where output signal 129 is generally at the midpoint of the data transmission on DQ bi-directional data bus 102, output signal 135 generally replicates the signal on connection 122 for the duration of output signal 129 and is zero otherwise. This is the desired state provided by the present invention.

In state B, where output signal 129 is forward of the midpoint of the data transmission on DQ bi-directional data bus 102, output signal 135 is corrupted, as indicated by reference numeral 210. Similarly, in state C, where output signal 129 is rearward of the midpoint of the data transmission on DQ bi-directional data bus 102, output signal 135 is corrupted as indicated by reference numeral 212. States B and C are generally prevented from occurring in accordance with the present invention.

Figure 6:
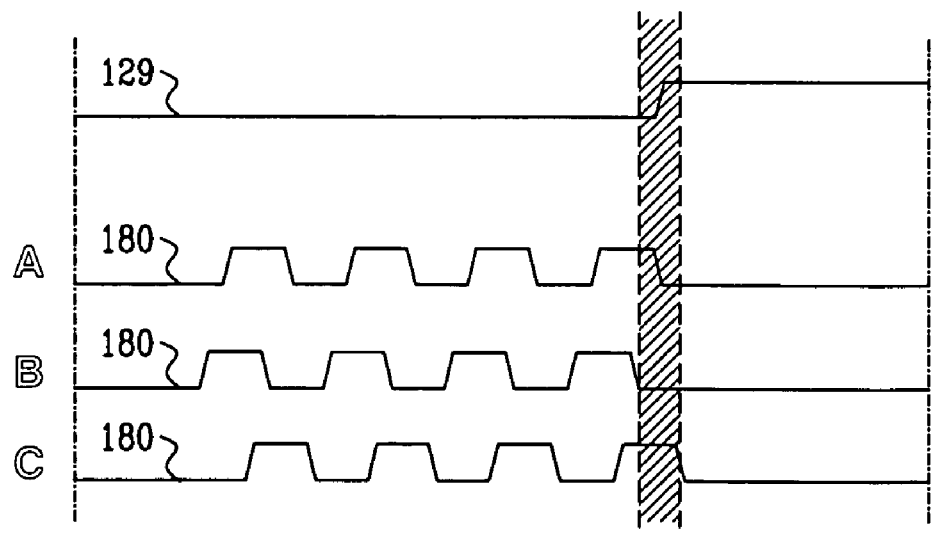
FIG. 6 is a series of timing diagrams illustrating yet another part of the operation of the circuitry of FIGS. 1 & 3.

Reference is now made to FIG. 6, which is a series of timing diagrams illustrating yet another part of the operation of the circuitry of FIGS. 1 & 3. FIG. 6 illustrates input signal 180 corresponding to predetermined signals on DQ bi-directional data bus 102 and on DQS bi-directional data strobe connection 122 in three different operational states, here designated A, B and C, corresponding to three different input signals 180 and emphasizes the precise timing relationship between the rising edge of output signal 129 and a last falling edge of input signal 180 within a time envelope defined by the time difference of 90 degrees between the delays produced by respective delay lines 190 and 192.

In state A, the last falling edge of input signal 180 lies generally within the time envelope defined by the time difference of 90 degrees between the delays produced by respective delay lines 190 and 192. In state B, the last falling edge of input signal 180 lies generally outside and forward of the time envelope defined by the time difference of 90 degrees between the delays produced by respective delay lines 190 and 192. In state C, the last falling edge of input signal 180 lies generally outside and rearward of the time envelope defined by the time difference of 90 degrees between the delays produced by respective delay lines 190 and 192. Drift direction detection input 144 from drift detection circuitry 132 provides an indication of which of the three states of drift is present to control logic circuitry 134.

Figure 7:
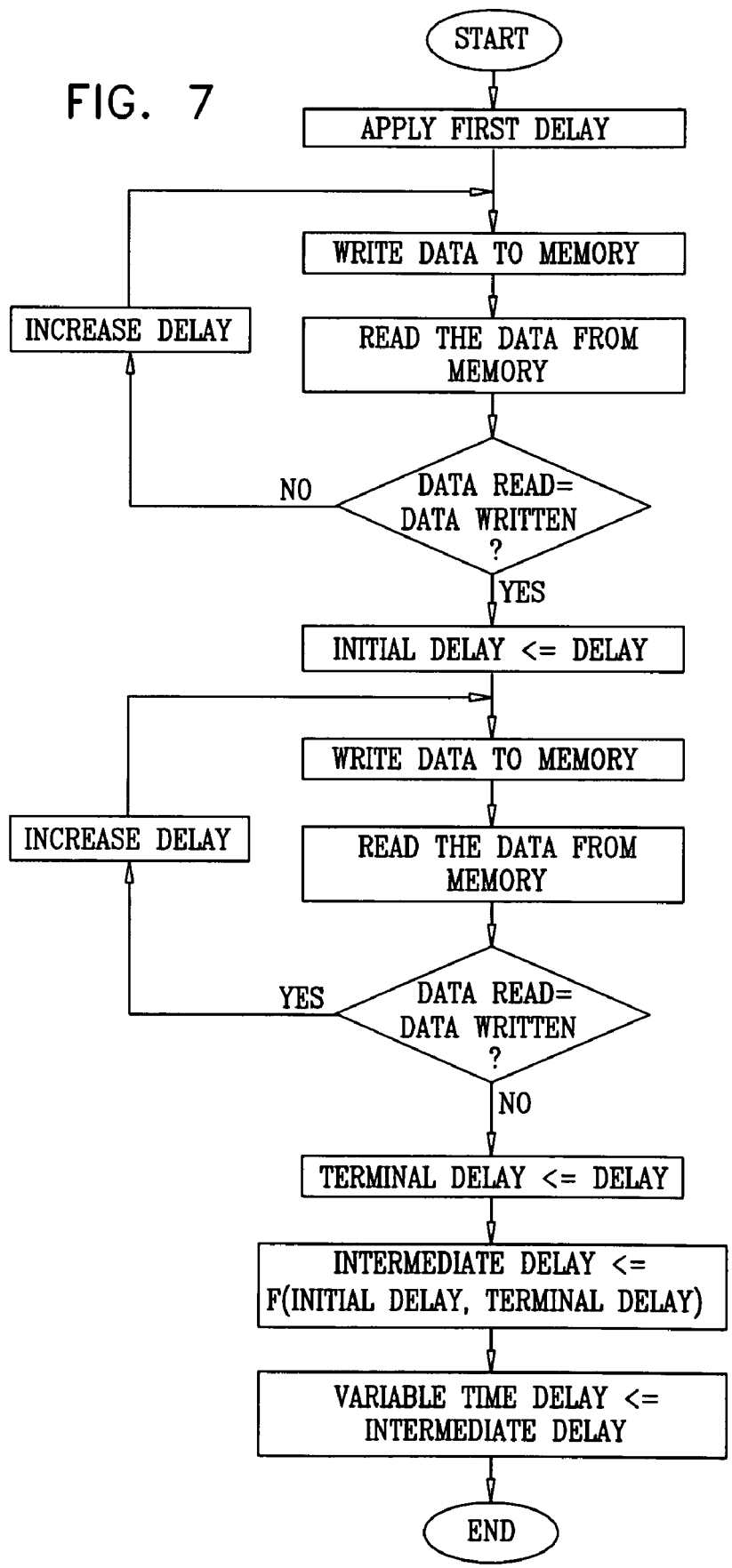
FIG. 7 is a simplified flow chart illustrating the operation of the circuitry of FIG. 2.

Reference is now made to FIG. 7, which is a simplified flow chart illustrating the operation of the control logic circuitry 134 of FIG. 2. As seen in FIG. 7, the control logic circuitry 134 preferably operates the data strobe masking gating signal modifier circuitry 130 to center the expected data receipt duration indicating signal about the midpoint of the duration of the data transmission using the following functionality:

a. applying to the expected data receipt duration indicating signal a first delay;

b. writing to the double data rate type memory at least a first burst of data;

c. reading from the double data rate type memory said at least a first burst of data;

d. comparing the at least a first burst of data obtained by the reading with the at least first burst of data written to the double data rate type memory during the writing step in order to determine whether write/read data integrity exists for the first delay;

e. setting an initial data integrity delay to the first delay if write/read data integrity exists for the first delay;

f. repeating steps b., c. and d. for increasing delays until write/read data integrity is found to exist for an initial data integrity delay, if write/read data integrity does not exist for the first delay;

g. repeating steps b., c. and d. for further increasing delays until write/read data integrity is found to not to exist for a terminal data integrity delay;

h. selecting an intermediate delay which is a function of the initial and terminal data integrity delays and applying said intermediate delay as the variable time delay.

Alternatively, control logic circuitry 134 may be operative to write to the double data rate type memory at least a first burst of data only once and step b. may be omitted from both steps f. and g. described above. In this alternative, the control logic circuitry 134 preferably operates the data strobe masking gating signal modifier circuitry 130 to center the expected data receipt duration indicating signal about the midpoint of the duration of the data transmission using the following functionality:

a. applying to the expected data receipt duration indicating signal a first delay;

b. writing to the double data rate type memory at least a first burst of data;

c. reading from the double data rate type memory said at least a first burst of data;

d. comparing the at least a first burst of data obtained by the reading with the at least first burst of data written to the double data rate type memory during the writing step in order to determine whether write/read data integrity exists for the first delay;

e. setting an initial data integrity delay to the first delay if write/read data integrity exists for the first delay;

f. repeating steps c. and d. for increasing delays until write/read data integrity is found to exist for an initial data integrity delay, if write/read data integrity does not exist for the first delay;

g. repeating steps c. and d. for further increasing delays until write/read data integrity is found to not to exist for a terminal data integrity delay;

h. selecting an intermediate delay which is a function of the initial and terminal data integrity delays and applying said intermediate delay as the variable time delay.

In another alternative embodiment, control logic circuitry 134 may be operative to write to the double data rate type memory at least a first burst of data only twice, once at step b. and again between steps f. and g. In this alternative, the control logic circuitry 134 preferably operates the data strobe masking gating signal modifier circuitry 130 to center the expected data receipt duration indicating signal about the midpoint of the duration of said data transmission using the following functionality:

a. applying to the expected data receipt duration indicating signal a first delay;

b. writing to the double data rate type memory at least a first burst of data;

c. reading from the double data rate type memory said at least a first burst of data;

d. comparing the at least a first burst of data obtained by the reading with the at least first burst of data written to the double data rate type memory during the writing step in order to determine whether write/read data integrity exists for the first delay;

e. setting an initial data integrity delay to the first delay if write/read data integrity exists for the first delay;

f. repeating steps c. and d. for increasing delays until write/read data integrity is found to exist for an initial data integrity delay, if write/read data integrity does not exist for the first delay;

f'. writing to the double data rate type memory at least a first burst of data;

g. repeating steps c. and d. for further increasing delays until write/read data integrity is found to not to exist for a terminal data integrity delay;

h. selecting an intermediate delay which is a function of the initial and terminal data integrity delays and applying said intermediate delay as the variable time delay.

It is appreciated that, while the above embodiments of control logic circuitry 134 include selecting an intermediate delay which is a function of the initial and terminal data integrity delays, control logic circuitry 134 may alternatively select an intermediate delay which is a function of the only initial data integrity delay. In this alternative, steps f' and g above may be obviated.

It will be appreciated by persons skilled in the art that the present invention is not limited by what has been particularly claimed hereinbelow. Rather the scope of the present invention includes various combinations and subcombinations of the features described hereinabove as well as modifications and variations thereof as would occur to persons skilled in the art upon reading the foregoing description with reference to the drawings and which are not in the prior art.

The invention claimed is:

1. Circuitry for reading from a double data rate type memory, said circuitry comprising:

control logic;

a first bi-directional input/output interface (I/O) configured to be coupled to a data bus of a double data rate type memory and to receive therefrom a data transmission having a duration selected by said control logic;

a second bi-directional input/output interface (I/O) configured to be coupled to a data strobe line of said double data rate type memory;

a gate coupled to said second bi-directional input/output interface configured for controlling the duration of a data strobe signal received along said data strobe line in response to a data strobe masking gating signal; and a data strobe masking gating signal modifier receiving from said control logic an expected data receipt duration indicating signal and an extent of delay indicating signal and applying to said expected data receipt duration indicating signal a variable time delay based at least in part on said extent of delay indicating signal such as to center said expected data receipt duration indicating signal about the midpoint of said duration of said data transmission.

2. Circuitry for reading from a double data rate type memory according to claim 1 and wherein said data strobe masking gating signal modifier is also operative to expand said expected data receipt duration indicating signal by less than a clock cycle prior to applying said variable time delay thereto.

3. Circuitry for reading from a double data rate type memory according to claim 1 and wherein said data strobe masking gating signal modifier is also operative to expand said expected data receipt duration indicating signal by one-half clock cycle prior to applying said variable time delay thereto.

4. Circuitry for reading from a double data rate type memory according to claim 1 and wherein said data strobe masking data signal modifier is configured to be operative to center said expected data receipt duration indicating signal about the midpoint of said duration of said data transmission using the following functionality:
    a. applying to said expected data receipt duration indicating signal a first delay;
    b. writing to said double data rate type memory at least a first burst of data;
    c. reading from said double data rate type memory said at least a first burst of data;
    d. comparing said at least a first burst of data obtained by said reading with said at least first burst of data written to said double data rate type memory during said writing in order to determine whether write/read data integrity exists for said first delay;
    e. setting an initial data integrity delay to said first delay if write/read data integrity exists for said first delay;
    f. repeating steps b., c. and d. for increasing delays until write/read data integrity is found to exist for an initial data integrity delay, if write/read data integrity does not exist for said first delay;
    g. repeating steps b., c. and d. for further increasing delays until write/read data integrity is found to not to exist for a terminal data integrity delay; and
    h. selecting an intermediate delay which is a function of said initial data integrity delay and said terminal data integrity delay and applying said intermediate delay as said variable time delay.

5. Circuitry for reading from a double data rate type memory according to claim 4 and wherein said functionality also comprises repeating steps a.-h. over time to compensate for variations in temperature and voltage.

6. Circuitry for reading from a double data rate type memory according to claim 1 and wherein said data strobe masking gating signal modifier is configured to be operative to center said expected data receipt duration indicating signal about the midpoint of said duration of said data transmission using the following functionality:
    a. applying to said expected data receipt duration indicating signal a first delay;
    b. writing to said double data rate type memory at least a first burst of data;
    c. reading from said double data rate type memory said at least a first burst of data;
    d. comparing said at least a first burst of data obtained by said reading with said at least first burst of data written to said double data rate type memory during said writing in order to determine whether write/read data integrity exists for said first delay;
    e. setting an initial data integrity delay to said first delay if write/read data integrity exists for said first delay;
    f. repeating steps c. and d. for increasing delays until write/read data integrity is found to exist for an initial data integrity delay, if write/read data integrity does not exist for said first delay;
    g. repeating steps c. and d. for further increasing delays until write/read data integrity is found to not to exist for a terminal data integrity delay; and
    h. selecting an intermediate delay which is a function of said initial data integrity delay and said terminal data integrity delay and applying said intermediate delay as said variable time delay.

7. Circuitry for reading from a double data rate type memory according to claim 1 and wherein said data strobe masking gating signal modifier is configured to be operative to center said expected data receipt duration indicating signal about the midpoint of said duration of said data transmission using the following functionality:
    a. applying to said expected data receipt duration indicating signal a first delay;
    b. writing to said double data rate type memory at least a first burst of data;
    c. reading from said double data rate type memory said at least a first burst of data;
    d. comparing said at least a first burst of data obtained by said reading with said at least first burst of data written to said double data rate type memory during said writing in order to determine whether write/read data integrity exists for said first delay;
    e. setting an initial data integrity delay to said first delay if write/read data integrity exists for said first delay;
    f. repeating steps c. and d. for increasing delays until write/read data integrity is found to exist for an initial data integrity delay, if write/read data integrity does not exist for said first delay;
    f'. writing to said double data rate type memory at least a first burst of data;
    g. repeating steps c. and d. for further increasing delays until write/read data integrity is found to not to exist for a terminal data integrity delay; and
    h. selecting an intermediate delay which is a function of said initial data integrity delay and said terminal data integrity delay and applying said intermediate delay as said variable time delay.

8. Circuitry for reading from a double data rate type memory according to claim 1 and wherein said data strobe masking gating signal modifier is configured to be operative to center said expected data receipt duration indicating signal about the midpoint of said duration of said data transmission using the following functionality:
    a. applying to said expected data receipt duration indicating signal a first delay;
    b. writing to said double data rate type memory at least a first burst of data;
    c. reading from said double data rate type memory said at least a first burst of data;
    d. comparing said at least a first burst of data obtained by said reading with said at least first burst of data written to said double data rate type memory during said writing in order to determine whether write/read data integrity exists for said first delay;
    e. setting an initial data integrity delay to said first delay if write/read data integrity exists for said first delay;
    f. repeating steps b., c. and d. for increasing delays until write/read data integrity is found to exist for an initial data integrity delay, if write/read data integrity does not exist for said first delay; and
    g. selecting an intermediate delay which is a function of said initial data integrity delay and applying said intermediate delay as said variable time delay.

9. Circuitry for reading from a double data rate type memory according to claim 1 and wherein said data strobe masking gating signal modifier is configured to be operative to center said expected data receipt duration indicating signal about the midpoint of said duration of said data transmission using the following functionality:
    a. applying to said expected data receipt duration indicating signal a first delay;
    b. writing to said double data rate type memory at least a first burst of data;
    c. reading from said double data rate type memory said at least a first burst of data;

d. comparing said at least a first burst of data obtained by said reading with said at least first burst of data written to said double data rate type memory during said writing in order to determine whether write/read data integrity exists for said first delay;

e. setting an initial data integrity delay to said first delay if write/read data integrity exists for said first delay;

f. repeating steps c. and d. for increasing delays until write/read data integrity is found to exist for an initial data integrity delay, if write/read data integrity does not exist for said first delay; and g. selecting an intermediate delay which is a function of said initial data integrity delay and applying said intermediate delay as said variable time delay.

10. Circuitry for reading from a double data rate type memory according to claim 1 and wherein said gate is an AND gate.

11. Circuitry for reading from a double data rate type memory according to claim 1 and also comprising drift detection circuitry operative to provide an indication of a timing relationship between a rising edge of said data strobe masking gating signal and a last falling edge of said data strobe signal to said control logic.

12. Circuitry for reading from a double data rate type memory according to claim 11 and wherein said indication comprises an indication of which one of three possible states of drift is present.

13. Circuitry for reading from a double data rate type memory according to claim 11 and wherein said data detection circuitry comprises:

a first latch supplying a first latch output;

a second latch supplying a second latch output;

a first delay line providing a first delay; and a second delay line providing a second delay;

and said circuitry includes the following functionality:

receiving an input from said second bi-directional I/O interface;

providing a first latch input to said first latch, said first latch input to said first latch comprising said second delay of said data strobe signal;

providing a second latch input to said first latch, said second latch input to said first latch comprising said first delay of said data strobe masking gating signal;

providing a first latch input to said second latch, said first latch input to said second latch comprising said data strobe signal; and providing a second latch input to said second latch, said second latch input to said second latch comprising said first delay of said data strobe masking gating signal, wherein said indication is a function of said first latch output and said second latch output.

14. Circuitry for reading from a double data rate type memory according to claim 13 and wherein said input from said second bi-directional I/O interface comprises a delayed input.

15. Circuitry for reading from a double data rate type memory according to claim 13 and wherein said first delay comprises a 45 degree delay and said second delay comprises a 90 degree delay.

16. Circuitry for reading from a double data rate type memory according to claim 11 and wherein said control logic is operative to provide said extent of delay indicating signal based on said indication.

* * * * *